United States Patent
Lin et al.

(10) Patent No.: US 11,763,895 B2
(45) Date of Patent: *Sep. 19, 2023

(54) POWER ARCHITECTURE FOR NON-VOLATILE MEMORY

(71) Applicant: Micron Technology, Inc., Boise, ID (US)

(72) Inventors: Qisong Lin, El Dorado Hills, CA (US); Shuai Xu, Santa Clara, CA (US); Jonathan S. Parry, Boise, ID (US); Jeremy Binfet, Boise, ID (US); Michele Piccardi, Cupertino, CA (US); Qing Liang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/873,850

(22) Filed: Jul. 26, 2022

(65) Prior Publication Data

US 2023/0017388 A1 Jan. 19, 2023

Related U.S. Application Data

(63) Continuation of application No. 17/168,970, filed on Feb. 5, 2021, now Pat. No. 11,404,129.

(51) Int. Cl.
*G11C 16/04* (2006.01)
*G11C 16/30* (2006.01)
(Continued)

(52) U.S. Cl.
CPC ............ *G11C 16/30* (2013.01); *G06F 3/0625* (2013.01); *G06F 3/0634* (2013.01);
(Continued)

(58) Field of Classification Search
CPC ..... G11C 16/30; G11C 16/10; G11C 16/0483; G11C 5/145; G11C 5/147; G11C 5/14;
(Continued)

(56) References Cited

U.S. PATENT DOCUMENTS

| | | | |
|---|---|---|---|
| 5,799,200 A | * | 8/1998 | Brant ............... G06F 1/30 713/340 |
| 7,512,010 B2 | | 3/2009 | Cho et al. |

(Continued)

FOREIGN PATENT DOCUMENTS

CN 101136249 A 3/2008

OTHER PUBLICATIONS

Chinese Patent Office, "Office Action", issued in connection with Chinese Patent Application No. 202210100174.X dated Jan. 6, 2023 (10 pages) (5 pages of English Translation and 5 pages of Original Document).

*Primary Examiner* — Tha-O H Bui
(74) *Attorney, Agent, or Firm* — Holland & Hart LLP

(57) ABSTRACT

Methods, systems, and devices for power architecture for non-volatile memory are described. A memory device may be configured to operate in a first mode and a second mode (e.g., a low power mode). When operating in the first mode, a voltage may be supplied from a power source (e.g., a power management integrated circuit) to a memory array and one or more associated components via a regulator. When the memory device transitions to operate in the second mode, some of the components supplied from the power source may be powered by a charge pump. Control information associated with the memory array may be stored to the one or more components (e.g., to a cache) that are powered by a charge pump.

20 Claims, 5 Drawing Sheets

(51) Int. Cl.
  *G06F 3/06*      (2006.01)
  *G06F 12/0875*   (2016.01)
  *G11C 16/10*     (2006.01)

(52) U.S. Cl.
  CPC ........ *G06F 3/0679* (2013.01); *G06F 12/0875* (2013.01); *G11C 16/10* (2013.01); *G06F 2212/603* (2013.01); *G11C 16/0483* (2013.01)

(58) Field of Classification Search
  CPC ..... G11C 5/148; G06F 3/0625; G06F 3/0634; G06F 3/0679; G06F 12/0875; G06F 2212/603; G06F 2212/1024; G06F 2212/1028; G06F 2212/7203; G06F 2212/7206; G06F 2212/7208; G06F 3/0688; G06F 12/0246
  USPC ................................... 365/185.18
  See application file for complete search history.

(56) References Cited

U.S. PATENT DOCUMENTS

| | | | |
|---|---|---|---|
| 7,999,605 B2 | 8/2011 | Seo | |
| 8,929,171 B2 | 1/2015 | Park et al. | |
| 9,263,098 B2* | 2/2016 | Yoo | H02M 3/158 |
| 2002/0049917 A1* | 4/2002 | Portman | G06F 1/30 |
| | | | 713/300 |
| 2005/0122791 A1* | 6/2005 | Hajeck | G06K 19/0701 |
| | | | 365/189.11 |
| 2008/0055991 A1 | 3/2008 | Kim et al. | |
| 2010/0327841 A1 | 12/2010 | Ito et al. | |
| 2019/0102261 A1 | 4/2019 | Cesaretti et al. | |

\* cited by examiner

POWER ARCHITECTURE FOR NON-VOLATILE MEMORY

CROSS REFERENCE

The present Application for Patent is a continuation of U.S. patent application Ser. No. 17/168,970 by Lin et al., entitled "POWER ARCHITECTURE FOR NON-VOLATILE MEMORY," filed Feb. 5, 2021, assigned to the assignee hereof, and is expressly incorporated by reference in its entirety herein.

FIELD OF TECHNOLOGY

The following relates generally to one or more systems for memory and more specifically to power architecture for non-volatile memory.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
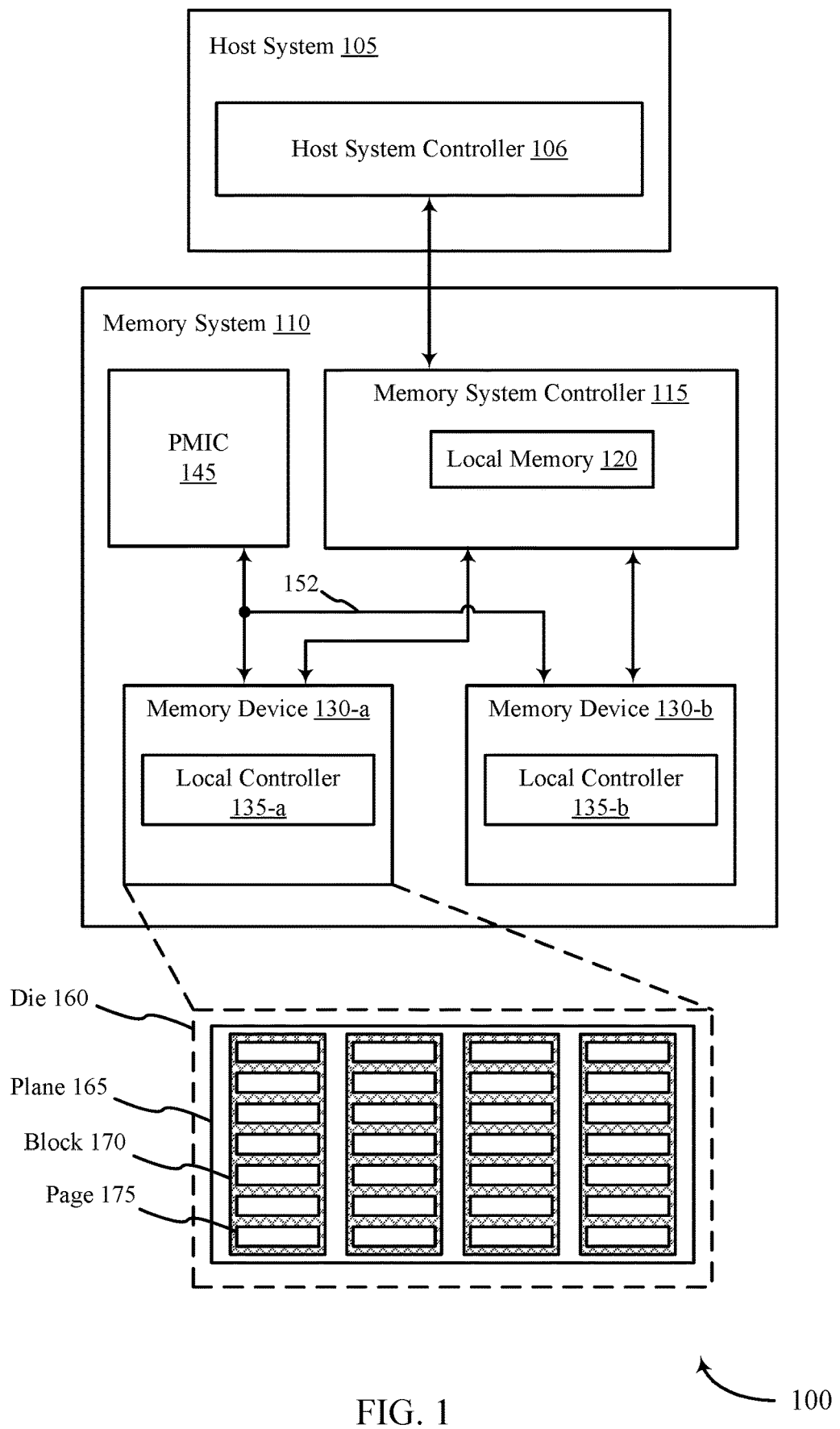
FIG. 1 illustrates an example of a system that supports power architecture for non-volatile memory in accordance with examples as disclosed herein.

To conserve power or other resources, a memory device may at sometimes operate in a low power mode, which may alternatively be referred to as a hibernate mode or sleep mode, among other possibilities. While operating in the low power mode, the memory device may consume less power relative to another operating mode, such as another mode in which the memory device may actively receive and execute commands from a host system. Some aspects of the memory device may be operated based on control information stored to memory cells, fuse banks (e.g., fuse arrays), or various registers. In some examples, the control information may be stored in volatile memory technology, such that if power is removed from the volatile memory technology, the information stored in the volatile memory technology may be erased or lost. When the memory device enters or exits the low power mode, the control information may be transferred between volatile memory and non-volatile memory in order for the memory device to operate as desired. However, in some instances, transferring control information may take a duration of time that may cause entering or exiting the low power mode have a relatively high latency, consume more power, or both. Thus a memory device configured to store control information to a portion that is powered when the memory device is in the low power mode may be desirable.

A memory device configured to store control information to a portion that is powered when the memory device is in the low power mode is described herein. The memory systems described herein may include non-volatile memory (NVM) devices, and a power management integrated circuit (PMIC) which produces one or more voltages (positive or negative) used by the memory devices. Different power domains may exist in the memory device. For example, components in a first power domain may be unpowered when the memory device is in a low power mode, while components in a second power domain may be powered whether in a low power mode or in a different mode. A memory device may receive a voltage (e.g., as part of a first power domain) that is applied, via a regulator, to a memory array and one or more components associated with the memory array when the memory device is operated in a first mode (e.g., a non-low-power mode). The one or more components associated with the memory array may include memory configured as temporary storage (e.g., a cache) that is configured to store control information for the memory array.

Additionally or alternatively, the memory device may receive an additional voltage (e.g., a third voltage; part of a second power domain), from the PMIC. The second voltage may power components (such as the I/O circuitry) regardless of the mode of operation of the memory device. The memory device may include a charge pump coupled with a voltage supply associated with the second power domain. When the charge pump is activated, the charge pump may be configured to modify the voltage of the second power domain to be the voltage of the first domain and supply power to one or more components in the first power domain (e.g., the cache). The charge pump may be activated and the regulator may be deactivated when the memory device is operated in the low power mode. Deactivating the regulator may isolate the memory array from a voltage (e.g., a supply voltage), and activating the charge pump may power the cache.

Accordingly, when the memory device exits the low power mode (e.g., when the memory array regains power), the memory array may be operated according to the control information stored in the cache. Because the cache was powered during the low power mode, the control information may not be transferred to and from non-volatile storage and otherwise subject the memory device to undesirably high latency. Thus powering the cache of a memory device when operating in a low power mode may improve the overall latency of the memory device.

Features of the disclosure are initially described in the context of memory systems as described with reference to FIGS. 1 and 2. Features of the disclosure are described in the context of a process flow diagram as described with reference to FIG. 3. These and other features of the disclosure are further illustrated by and described with reference to an apparatus diagram and a flowchart that relate to power architecture for non-volatile memory as described with reference to FIGS. 4 and 5.

FIG. 1 illustrates an example of a system 100 that supports power architecture for non-volatile memory in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA)controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support power architecture for non-volatile memory. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some examples, the memory system 110 may include or may be coupled with a PMIC 145 that is configured to power one or more memory devices 130. The PMIC may include one or more DC-DC converters, which may be or may include charge pumps or boost converters, for providing a supply voltage to the memory devices 130. The PMIC 145 may provide multiple supply voltages to a single memory device 130. For example, the PMIC 145 may be configured to provide a first voltage (e.g., VCC_EXT) and a third voltage (e.g., VCCQ) to a memory device 130, and the respective voltages may be used to power various components of the respective memory device 130.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, a memory device 130 may be configured to operate in a first mode (e.g., a non-low-power mode) and in a second mode (e.g., a low power mode, a hibernate mode). The memory device 130 may include different power domains that are activated or deactivated based on operating in different modes. For example, a first power domain may be activated during a first mode, but may be deactivated during the second mode (e.g., the low power mode). In contrast, a second power domain may be activated during both the first mode and the second mode. Some components in the first power domain (e.g., some caches or volatile storage) may store control information used to operate the memory device. Thus, when entering a low power mode, the memory device 130 may cause the control information stored in the cache into non-volatile memory, which may take time and power. The memory device 130 may be configured with a charge pump that converts a voltage level associated with the second power domain to a voltage level associated with the first power domain and powers some components in the first power domain when operating in the low power mode. The memory device 130 may include temporary storage (e.g., cache storage, not shown) that is configured to be powered when the memory device 130 is operating in the second mode. For example, the memory device 130-a may include a regulator, a charge pump, and one or more components that are associated with the die 160. The memory device 130-a may be configured to receive a first voltage and a third voltage from the PMIC 145.

When operating in the first mode, a regulator of the memory device 130-a may be activated to provide a second voltage (e.g., a voltage different than the first voltage provided by the PMIC 145) to a first power domain of the die 160. The die 160 may be operated according to control information (e.g., trim settings) that are stored to one or more components that are associated with the die 160 (e.g., a cache). When the memory device 130-a enters the second mode, the regulator may be deactivated and the charge pump may be activated. The charge pump may, based on receiving the third voltage, provide a voltage (e.g., the second voltage) to the cache in order to power the cache while the memory device 130-a is in the second mode.

Accordingly, when the memory device 130-a exits the low power mode (e.g., when the die 160 regains power), the memory device 130-a may be operated according to the control information stored to the cache. Because the cache was powered during the low power mode, the control information may not be transferred from the non-volatile storage and otherwise subject the memory device 130-a to undesirably high latency. Thus powering the cache of a memory device 130 when operating in a low power mode (even though it may be in a power domain that is deactivated during the low power mode) may improve the overall latency of the particular memory device 130.

Figure 2:
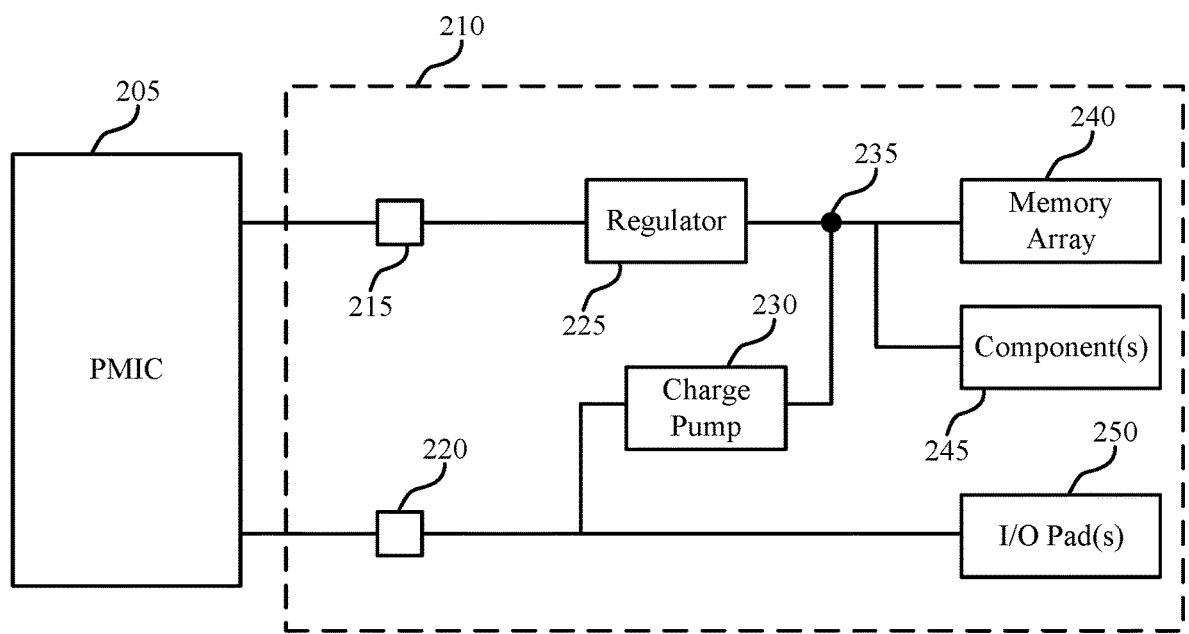
FIG. 2 illustrates an example of a memory system that supports power architecture for non-volatile memory in accordance with examples as disclosed herein.

FIG. 2 illustrates an example of a memory system 200 that supports power architecture for non-volatile memory in accordance with examples as disclosed herein. The memory system 200 may include a PMIC 205 that is coupled with a memory device 210. The PMIC may produce one or more voltages (e.g., positive or negative) used by the memory device 210 (e.g., by NVMs of the memory device 210). The memory device 210 may include a regulator 225 that is configured to receive a voltage (e.g., a first voltage) from the PMIC and provide a voltage (e.g., a second voltage) to a memory array 240 and one or more components 245 that are associated with the memory array 240. The memory device 210 may include a charge pump 230 that is configured to receive a voltage (e.g., a third voltage) from the PMIC 205. The third voltage may also be supplied to one or more I/O pads 250.

The memory device 210 may be configured to operate in different modes. For example, the memory device 210 may operate in a first mode where the memory array 240 operates based on receiving a voltage (e.g., a second voltage) from the regulator 225. In other examples, the memory device 210 may operate in a second mode (e.g., a low power mode, a hibernate mode) where the memory array 240 is isolated from a voltage (e.g., the second voltage) and the one or more components 245 associated with the memory array 240 are powered via the charge pump 230. The first mode may correspond to a high power mode where some or all of the functionality of the memory device is possible. The second mode may correspond to a low power mode where some components are deactivated. Some battery-powered devices (such as smart phones or other electronic devices) may enter a low-power mode to preserve battery life. As part of the low-power mode, some components (e.g., some power domains) of a memory device may be deactivated to conserve power. In some cases, some non-volatile memory (e.g., caches or SRAM) may be deactivated during the low power mode and the information (e.g., control information used to operate the memory device) stored therein may be transferred to non-volatile storage. Then, when exiting the low power mode, the information may be retrieved form the non-volatile storage and used for its intended purpose. To avoid transferring such information to and from non-volatile storage upon entering or exiting the low power mode, a charge pump may be coupled with a second power domain that is always powered and may be configured to supply power to some components of a first power domain that is deactivated during the low power mode. For example, the charge pump 230 may provide a voltage (e.g., a third voltage) to the one or more components 245, which may allow the one or more components 245 to store control information while the memory device is in a low power mode. Accordingly, when the memory device 210 enters (e.g., reenters) the first mode, control information for operating the memory array 240 may be loaded from the one or more components 245, which may improve the latency of the memory system 200.

In some examples, the PMIC 205 may be configured to provide one or more supply voltages to the memory device 210. For example, the PMIC 205 may provide a supply voltage (VCC(i)) to the memory device 210, where i=1, 2, 3, etc. In some examples, the supply voltages may be a drain power voltage or a programming power voltage for the memory device 210, and may be positive or negative voltages. The PMIC 205 may provide a supply voltage to memory device 210 that is within a defined voltage range (e.g., as defined by a standard).

The PMIC 205 may provide various supply voltages to the memory device 210 using a respective DC-DC converter. For example, the PMIC may include a quantity (N) of DC-DC converters that correspond to the quantity (N) supply voltages of the memory system 200. The supply voltage may be provided by respective charge pumps or boost converters. In some examples, each DC-DC converter may be or may include a boost converter, charge pump, step up converter, buck/boost converter, flyback converter, or any type or combination of types of DC-DC converters.

As shown in FIG. 2, the PMIC 205 may provide at least two voltages (e.g., two supply voltages) to the memory device 210, and each voltage may be associated with a respective power domain. For example, the PMIC 205 may provide a first voltage that is associated with a first power domain that is received at an interface 215 (e.g., a pad). In some examples, the first voltage (e.g., VCC_EXT) may be approximately 2.35V. Additionally or alternatively, the PMIC 205 may provide a third voltage that is associated with a second power domain that is received at an interface 220 (e.g., a pad). In some cases, the third voltage (e.g., VCCQ) may be approximately 1.2V. That is, the charge pump 230 and the I/O pad(s) 250 may continually receive the third voltage, however the charge pump 230 may be periodically disabled such that an associated voltage (e.g., a voltage based on the charge pump 230 receiving the voltage) is not applied to the node 235.

The memory device 210 may include a regulator 225 that is configured to receive the first voltage from the PMIC. In some examples, the regulator 225 may include one or more transistors that are configured to regulate (e.g., alter, shift) the first voltage. For example, the regulator 225 may be or may include a level shifter that is configured to shift (e.g., downshift) the first voltage to a second voltage. In other examples, the regulator may include one or more n-channel transistors (e.g., NMOS transistors) that can be configured as a diode. The regulator 225, shown in and discussed with reference to FIG. 2, may include a single n-channel transistor that is configured as a diode when the memory device 210 is operating in a second mode (e.g., in a low power mode, a hibernate mode). A gate of the n-channel transistor of the regulator 225 may be coupled with a signal line (e.g., a control signal line) that is configured to receive a control signal for activating or deactivating the transistor. In some examples, the control signal may be applied or initiated by a memory controller, such as a memory system controller 115 or a local controller 135-a as described with reference to FIG. 1.

In some examples, the regulator 225 may supply a voltage (e.g., a second voltage) to the memory array 240, via node 235, when the memory device 210 is operating in a first mode. A first mode (e.g., a first operational mode) may refer to any mode where the memory array 240 is not in a low power state (e.g., a hibernate state). For example, when operated in a first mode, the memory array 240 may be powered based on receiving the second voltage and data may be stored to one or more memory cells of the memory array 240. As described herein, the memory array 240 may include one or more NVM cells, such as NAND flash memory cells.

The memory array 240 may include one or more components, such as pumps (e.g., charge pumps), switches, or other circuitry that may effectively disable (e.g., power off) the memory array 240 when the memory device 210 is operating in a second mode. For example, when operating in the second mode, the regulator 225 may not supply the second voltage to the memory array 240 and/or other components (such as caches and SRAM). When the memory device includes the charge pump 230, some components in the power domain associated with the second voltage may still receive a voltage from the charge pump 230 despite not receiving a voltage from the regulator 225. However, when operating in a low power mode, the pumps, switches, or other circuitry of the memory array 240 may be disabled such that the memory array 240 is not powered. Conversely, when operating in a first mode, the pumps, switches, or other circuitry may be enabled to operate the memory array 240.

The memory device 210 may include one or more components 245 that are associated with the memory array 240. For example, the components 245 may include latches, fuses, switches, redundant rows, or temporary storage (e.g., cache storage) that may store control information (or other information) for operating the memory array 240. The control information may include, among other types of information, trim settings for operating the memory array 240. Examples of the components 245 may include a cache (e.g., a cache storage) but may include components other than memory cells configured as cache storage.

When operating in the first mode, the memory device 210 may receive a first voltage from the PMIC 205. The first voltage may be received at the interface 215 and may be provided to the regulator 225. A control signal may be applied to the regulator 225 (e.g., to a gate of a n-channel transistor of the regulator 225) such that the regulator 225 may supply a second voltage to the node 235. In some examples, the second voltage may be provided to the memory array 240 and the components 245. By supplying the second voltage to the memory array 240, the memory array 240 may store user data to one or more memory cells (e.g., NVM cells).

The PMIC 205 may provide a third voltage that is received at the interface 220 and may be configured to power the I/O pads 250. Because the I/O pads 250 communicate with a controller or a host system, the I/O pads 250 may be powered during low power mode so that the memory device can continue to receive commands. The interface 220 may be coupled with a charge pump 230 that is configured to receive the third voltage. In some examples, the charge pump 230 may include any type of DC-DC converter(s), such as a charge pump boost converter, step up converter, buck/boost converter, flyback converter, or another type of DC-DC converter. Upon receiving the third voltage from the interface 220, the charge pump 230 may provide a voltage to the node 235. In some examples, the voltage may be the second voltage (e.g., VCCR).

The charge pump 230 may operate when the memory device 210 is operating in the second mode. For example, the charge pump 230 may be powered upon the memory device 210 transitioning to operate in the second mode, such that the charge pump 230 may power the components 245 when the memory array 240 is disabled (e.g., powered off). By providing power to the components 245, the components 245 may store control information that may be loaded to the memory array 240 upon the memory device 210 transitioning to operate in the first mode (e.g., based on the memory device 210 transitioning out of a low power mode). That is, control information may be stored to the components 245 before the memory device 210 enters the low power state, such that the control information may be readily accessible when the memory array 240 transitions out of the low power state. Accordingly, overall latency of exiting or entering the low power mode by the memory device 210 may be improved.

Figure 3:
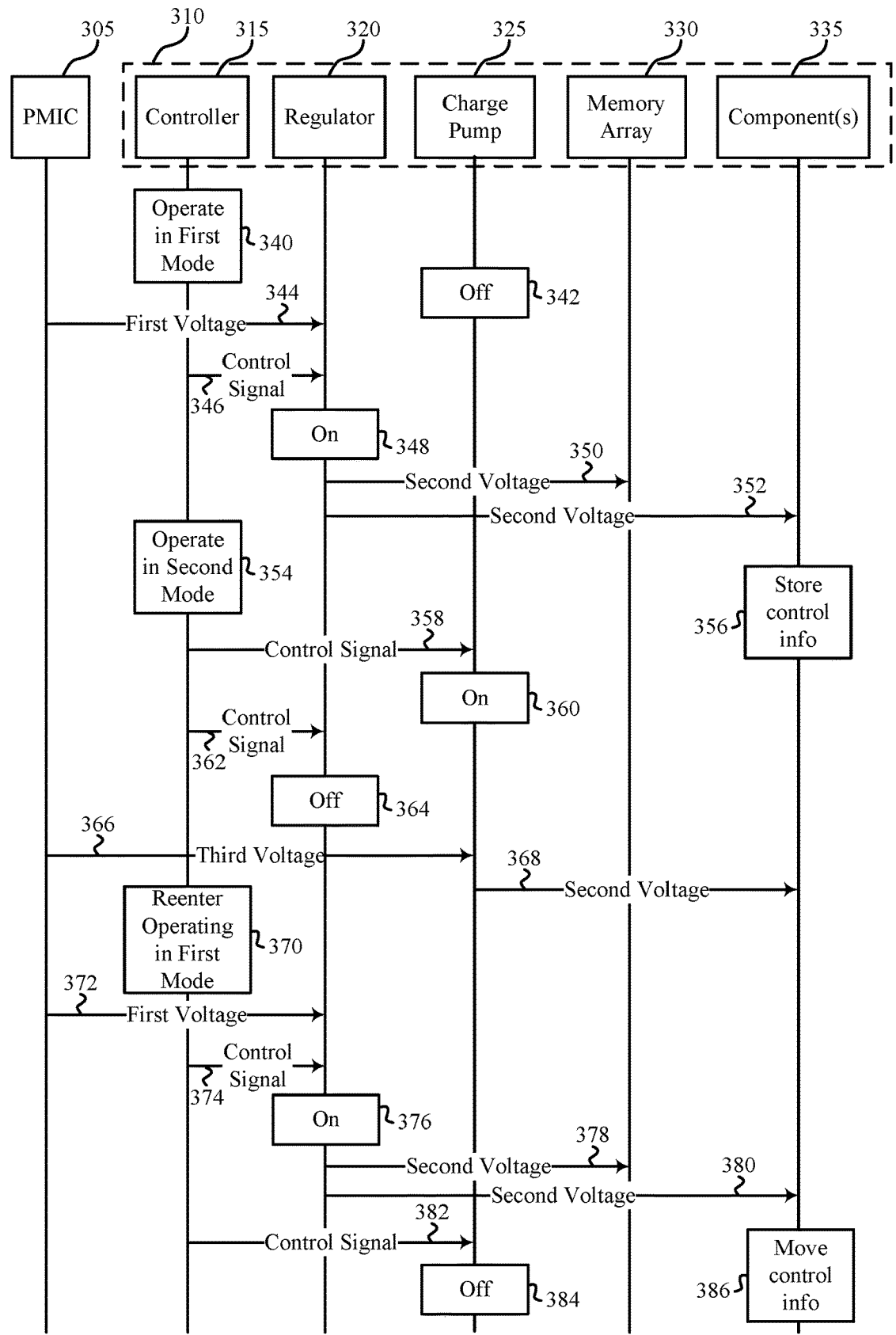
FIG. 3 illustrates an example of a process flow diagram that supports power architecture for non-volatile memory in accordance with examples as disclosed herein.

FIG. 3 illustrates an example of a process flow diagram 300 that supports power architecture for non-volatile memory in accordance with examples as disclosed herein. The process flow diagram 300 may illustrate one or more operations of a PMIC 305, memory device 310, controller 315, regulator 320, charge pump 325, memory array 330, and one or more components 335 that are associated with the memory array 330. In some examples, the PMIC 305, memory device 310, regulator 320, charge pump 325, memory array 330, and one or more components 335 that are associated with the memory array 330 may be examples of the same components as described with reference to FIG. 2. Additionally or alternatively, the controller 315 may be an example of a memory system controller 115 or a local controller 135-a as described with reference to FIG. 1. The process flow diagram 300 may illustrate operating the memory device 310 in a first mode and a second mode. Control information may be stored to the components 335 when operating in the second mode such that the control information may be loaded to the memory array 330 upon the memory device 310 entering (e.g., reentering) the first mode, which may improve the latency of the associated memory system.

At 340, it may be determined to operate the memory device 310 in the first mode (e.g., it may be determined by the controller 315). As described herein, the first mode may refer to any mode where the memory array 330 is not in a low power state (e.g., a hibernate state). For example, when operated in a first mode, the memory array 330 may be powered based on receiving a second voltage from the regulator 320, and data may be stored to one or more memory cells of the memory array 340. At 342, the charge pump 325 may be powered off based on the controller 315 determining to operate the memory device 310 in the first mode. In some examples, the charge pump 325 may continue to receive a voltage (e.g., a third voltage), but may not provide a voltage (e.g., a second voltage) to the components 335 associated with the memory array 330.

At 344, a first voltage may be provided to the regulator 320 (e.g., it may be provided by the PMIC 305). As described herein, the first voltage may be received at an interface (e.g., a pad) and may be approximately 2.35V. At 346, the controller 315 may initiate a control signal being applied to the regulator 320. For example, the control signal may be applied to a transistor (e.g., a n-channel transistor) included in the regulator 320. At 348, the regulator 320 may be enabled (e.g., turned on) based on the control signal being applied.

At 350, a second voltage may be applied from the regulator 320 to the memory array 330. In some examples, the second voltage may be approximately 2.0V and may result from the regulator 320 shifting the first voltage (e.g., 2.35V) to a lower voltage (e.g., 2.0V). The memory array 330 may operate to store user data based on the second voltage being applied. As discussed herein, the memory array 330 may operate based on one or more pumps, switches, or other circuitry being enabled.

At 352, the second voltage may be applied from the regulator 320 to the one or more components 335 associated with the memory array 330. In some examples, the second voltage may be approximately 2.0V and may result from the regulator 320 shifting the first voltage (e.g., 2.35V) to a lower voltage (e.g., 2.0V). The one or more components 335 associated with the memory array 330 may operate to store control information or other data based on the second voltage being applied.

At 354, it may be determined to operate the memory device 310 in the second mode (e.g., it may be determined by the controller 315). As described herein, the second mode may refer to a low power mode or a hibernate mode where the memory array 330 is powered down (e.g., placed into a hibernate state). For example, when operated in the second mode, the memory array 330 may be disabled (e.g., powered off) by isolating it from the second voltage (e.g., the second voltage applied at 350).

At 356, control information may be stored to the one or more components 335 (e.g., a cache) based on the controller 315 determining to operate the memory device 310 in the second mode. In some cases, the control information may be moved from components that may be deactivated during the mode to a storage component that may remain powered during the low power mode (e.g., the one or more components 335). For example, control information may be moved from an SRAM that may be deactivated to a cache that may remain activated or powered. In some examples, the control information may be read from the memory array 330 and written to a cache included in the components 335 in anticipation of the memory array 330 entering the low power mode. The control information may be stored to the cache included in the components 335 such that, when the memory array 330 re-enters the first mode, the control information may be read from the cache, which may reduce the latency that would otherwise be incurred by reading the control information from the memory array 330.

At 358, a control signal may be initiated and applied to the charge pump 325 to activate the charge pump 325 (e.g., it may be initiated by the controller 315). In some examples, the controller 315 may apply the control signal in response to the control information being stored to the cache (e.g., to the components 335 associated with the memory array 330). At 360, the charge pump 325 may be powered on based on the controller 315 applying the control signal. In some examples, the charge pump 325 may have received a voltage (e.g., a third voltage) while disabled, thus enabling the charge pump 325 may allow for the charge pump to provide a voltage (e.g., a second voltage) to the components 335 relatively quickly.

At 362, a control signal may be initiated and applied to or remove a control signal being applied to the regulator 320 to deactivate the regulator (e.g., it may be initiated by the controller 315). For example, the control signal that was applied at 346 may be removed from the transistor. That is, the control signal applied at 346 may have been continually applied to the gate of the transistor and, at 362, may be removed. In other examples, a control signal may be applied to the regulator 320, which may disable (e.g., turn off, deactivate) the regulator 320. At 364, the regulator 320 may be disabled (e.g., turned off) based on the control signal being applied or removed.

At 368, the second voltage (e.g., 2.0V) may be applied to the one or more components 335 associated with the memory array 330 (e.g., it may be applied by the charge pump 325). For example, the second voltage may be applied to a cache in order to power the cache while the memory device 310 is in the low power mode (e.g., the second mode). Powering the cache while the memory device 310 is in the low power mode may allow for the control information (stored at 356) to be loaded relatively quickly when the memory array 330 enters (e.g., re-enters) the first mode. As described herein, the charge pump may include one or more boost converters or level shifters that increases the third voltage (e.g., 1.2V) to the second voltage (e.g., 2.0V).

At 370, it may be determined to operate the memory device 310 in the first mode for a second time (e.g., it may be determined by the controller 315). For example, the memory device 310 may reenter operating in the first mode. At 372, the PMIC 305 may provide a first voltage to the regulator 320. As described herein, the first voltage may be received at an interface (e.g., a pad) and may be approximately 2.35V. At 374, the controller 315 may initiate a control signal being applied to the regulator 320. For example, the control signal may be applied to a transistor (e.g., a n-channel transistor) included in the regulator 320. At 376, the regulator 320 may be enabled (e.g., turned on) based on the control signal being applied.

At 378, a second voltage may be applied from the regulator 320 to the memory array 330. In some examples, the second voltage may be approximately 2.0V and may result from the regulator 320 shifting the first voltage (e.g., 2.35V) to a lower voltage (e.g., 2.0V). At 380, the second voltage may be applied from the regulator 320 to the one or more components 335 associated with the memory array 330. In some examples, the second voltage may be approximately 2.0V and may result from the regulator 320 shifting the first voltage (e.g., 2.35V) to a lower voltage (e.g., 2.0V).

At 382, a control signal may be initiated and applied to the charge pump 325 to deactivate the charge pump 325 (e.g., it may be initiated by the controller 315). In some examples, the controller 315 may apply the control signal in response to the components 335 being powered independent from the charge pump 325. That is, the charge pump 325 may be deactivated at a time other than the time illustrated by FIG. 3, such that the components 335 are being powered (e.g., by the second voltage applied by the regulator 320) when the charge pump 325 is deactivated. At 384, the charge pump 325 may be powered off based on the control signal being applied (e.g., at 372). In some examples, the charge pump 325 may continue to receive a voltage (e.g., a third voltage), but may not provide a voltage (e.g., a second voltage) to the components 335 associated with the memory array 330.

At 386, the control information may be loaded from the one or more components 335 associated with the memory array 330 (e.g., from the cache) into the components associated with the control information. In some examples, the memory array 330 may be operated according to the control information, which may include trim settings for operating the memory array 330. As described herein, by loading the control information from the components 335 (e.g., operating the memory array 330 according to the control information), the control information may not be loaded from the memory array 330. Accordingly loading the control information from the components 335 may reduce the overall latency of the memory device 310 because loading from a cache may be faster than loading from a non-volatile storage (such as NAND).

Figure 4:
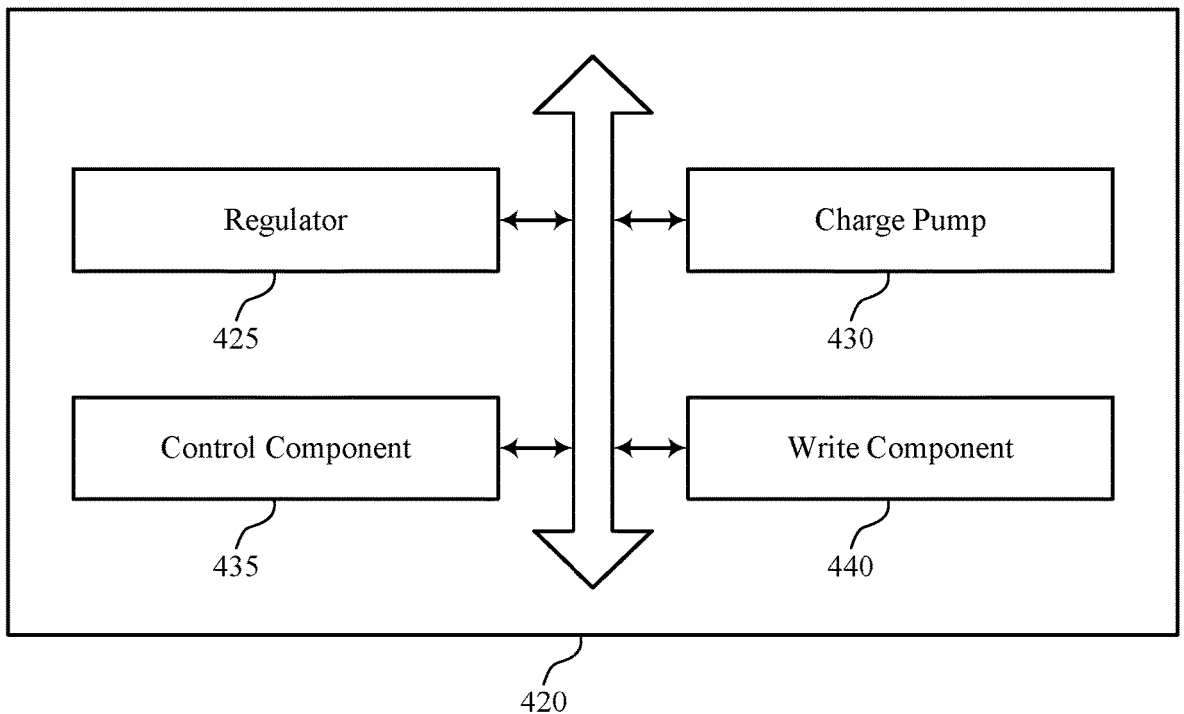
FIG. 4 shows a block diagram of a memory device that supports power architecture for non-volatile memory in accordance with examples as disclosed herein.

FIG. 4 shows a block diagram 400 of a device 420 that supports power architecture for non-volatile memory in accordance with examples as disclosed herein. The device 420 may be an example of aspects of a memory system or a memory device as described with reference to FIGS. 1 through 3. The device 420, or various components thereof, may be an example of means for performing various aspects of power architecture for non-volatile memory as described herein. For example, the device 420 may include a regulator 425, a charge pump 430, a control component 435, a write component 440, or any combination thereof. Each of these components may communicate, directly or indirectly, with one another (e.g., via one or more buses).

The regulator 425 may be configured as or otherwise support a means for receiving a first voltage from a first voltage source. In some examples, the regulator 425 may be configured as or otherwise support a means for supplying a second voltage to a non-volatile memory array and one or more components associated with the non-volatile memory array in response to operating in a first mode and receiving the first voltage.

The charge pump 430 may be configured as or otherwise support a means for receiving a third voltage from a second voltage source that is configured to supply the third voltage to one or more I/O components associated with the non-volatile memory array in response to operating in the first mode or a second mode. In some examples, the charge pump 430 may be configured as or otherwise support a means for supplying the second voltage to the one or more components in response to operating the non-volatile memory array in the second mode.

The control component 435 may be configured as or otherwise support a means for deactivating the regulator to cease supplying the second voltage to the non-volatile memory array and the one or more components in response to operating the non-volatile memory array in the second mode. In some examples, the control component 435 may be configured as or otherwise support a means for determining to operate the non-volatile memory array in the second mode, where the regulator is deactivated in response to determining to operate the non-volatile memory array in the second mode.

In some examples, to support deactivating the regulator, the control component 435 may be configured as or otherwise support a means for removing a control signal from the regulator in response to determining to operate the non-volatile memory array in the second mode, where the non-volatile memory array is isolated from the first voltage source in response to removing the control signal from the regulator. In some examples, to support supplying the second voltage to the one or more components, the control component 435 may be configured as or otherwise support a means for applying a signal to the charge pump in response to determining to operate the non-volatile memory array in the second mode, where the charge pump is configured to apply the second voltage to the one or more components in response to receiving the third voltage from the second voltage source.

In some examples, the control component 435 may be configured as or otherwise support a means for determining to operate the non-volatile memory array in the first mode, where the regulator is activated in response to determining to operate the non-volatile memory array in the first mode.

In some examples, the control component 435 may be configured as or otherwise support a means for activating the regulator in response to determining to operate the non-volatile memory array in the first mode, where the second voltage is applied to the non-volatile memory array in response to activating the regulator. In some examples, the control component 435 may be configured as or otherwise support a means for deactivating the charge pump to cease supplying the second voltage to the one or more components in response to activating the regulator.

In some examples, the one or more components associated with the non-volatile memory array includes a cache, and the write component 440 may be configured as or otherwise support a means for writing data from the non-volatile memory array to the cache in response to determining to operate the non-volatile memory array in the second mode, where the cache is configured to be powered when the non-volatile memory array is operating in the second mode.

In some examples, the one or more components associated with the non-volatile memory array includes a cache, and the write component 440 may be configured as or otherwise support a means for writing data from the cache to the non-volatile memory array upon operating the non-volatile memory array in the first mode. In some examples, the one or more components associated with the non-volatile memory array includes a cache, and the write component 440 may be configured as or otherwise support a means for storing control information to the cache, where the cache is configured to store the control information when the non-volatile memory array is operating in the second mode, and where the control information includes trim settings for operating the non-volatile memory array.

In some examples, the control signal is removed from the regulator a duration after supplying the second voltage to the one or more components. In some examples, the first voltage is greater than the second voltage and the third voltage.

Figure 5:
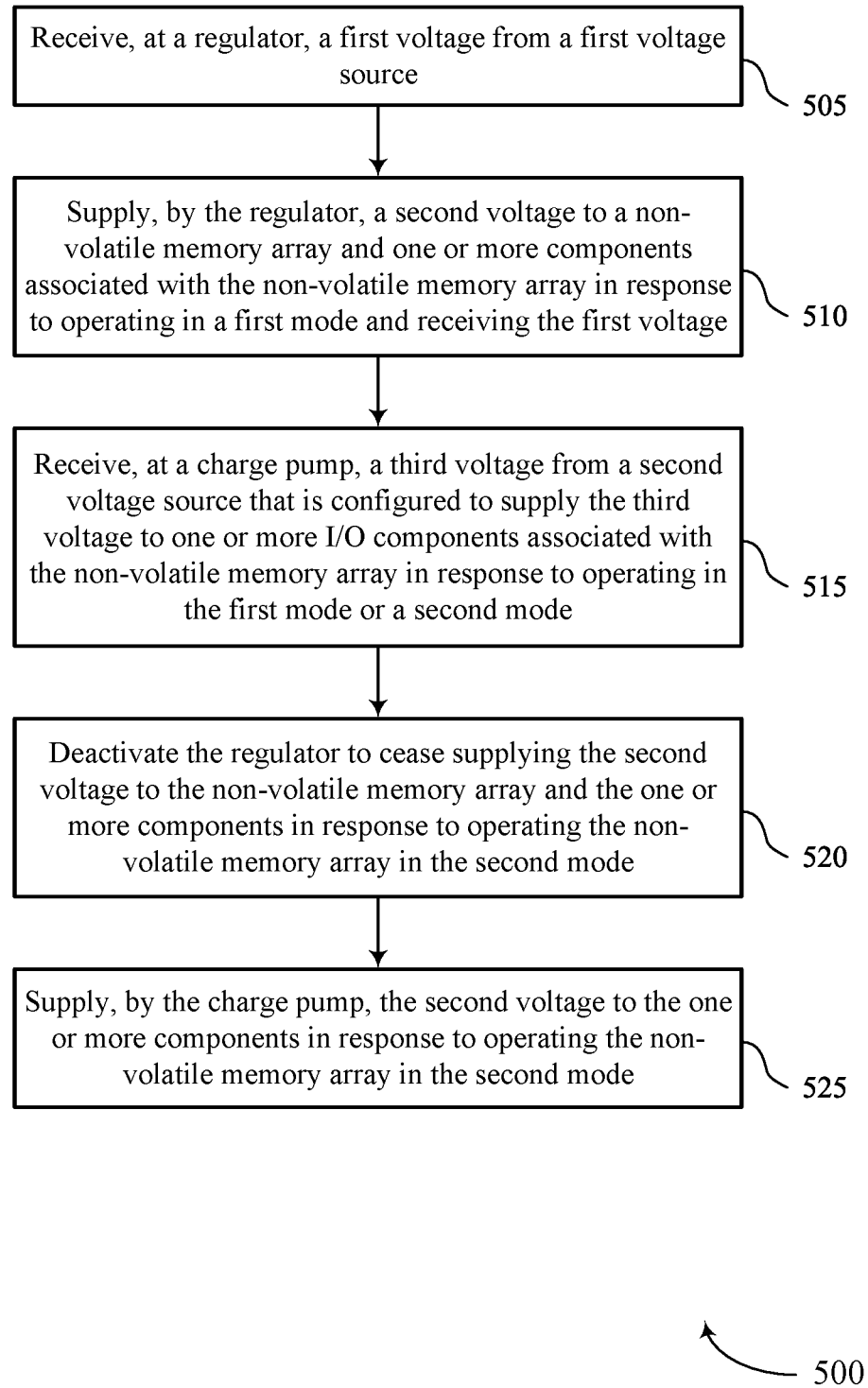
FIG. 5 shows a flowchart illustrating a method or methods that support power architecture for non-volatile memory in accordance with examples as disclosed herein.

FIG. 5 shows a flowchart illustrating a method 500 that supports power architecture for non-volatile memory in accordance with examples as disclosed herein. The operations of method 500 may be implemented by a memory system or a memory device or its components as described herein. For example, the operations of method 500 may be performed by a memory system or a memory device as described with reference to FIGS. 1 through 4. In some examples, a memory system or a memory device may execute a set of instructions to control the functional elements of the device to perform the described functions. Additionally or alternatively, the memory system or the memory device may perform aspects of the described functions using special-purpose hardware.

At 505, the method may include receiving, at a regulator, a first voltage from a first voltage source. The operations of 505 may be performed in accordance with examples as disclosed herein. In some examples, aspects of the operations of 505 may be performed by a regulator 425 as described with reference to FIG. 4.

At 510, the method may include supplying, by the regulator, a second voltage to a non-volatile memory array and one or more components associated with the non-volatile memory array in response to operating in a first mode and receiving the first voltage. The operations of 510 may be performed in accordance with examples as disclosed herein. In some examples, aspects of the operations of 510 may be performed by a regulator 425 as described with reference to FIG. 4.

At 515, the method may include receiving, at a charge pump, a third voltage from a second voltage source that is configured to supply the third voltage to one or more I/O components associated with the non-volatile memory array in response to operating in the first mode or a second mode. The operations of 515 may be performed in accordance with examples as disclosed herein. In some examples, aspects of the operations of 515 may be performed by a charge pump 430 as described with reference to FIG. 4.

At 520, the method may include deactivating the regulator to cease supplying the second voltage to the non-volatile memory array and the one or more components in response to operating the non-volatile memory array in the second mode. The operations of 520 may be performed in accordance with examples as disclosed herein. In some examples, aspects of the operations of 520 may be performed by a control component 435 as described with reference to FIG. 4.

At 525, the method may include supplying, by the charge pump, the second voltage to the one or more components in response to operating the non-volatile memory array in the second mode. The operations of 525 may be performed in accordance with examples as disclosed herein. In some examples, aspects of the operations of 525 may be performed by a charge pump 430 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for receiving, at a regulator, a first voltage from a first voltage source, supplying, by the regulator, a second voltage to a non-volatile memory array and one or more components associated with the non-volatile memory array in response to operating in a first mode and receiving the first voltage, receiving, at a charge pump, a third voltage from a second voltage source that is configured to supply the third voltage to one or more I/O components associated with the non-volatile memory array in response to operating in the first mode or a second mode, deactivating the regulator to cease supplying the second voltage to the non-volatile memory array and the one or more components in response to operating the non-volatile memory array in the second mode, and supplying, by the charge pump, the second voltage to the one or more components in response to operating the non-volatile memory array in the second mode.

Some examples of the method 500 and the apparatus described herein may further include operations, features, circuitry, logic, means, or instructions for determining to operate the non-volatile memory array in the second mode, where the regulator may be deactivated in response to determining to operate the non-volatile memory array in the second mode.

In some examples of the method 500 and the apparatus described herein, the one or more components associated with the non-volatile memory array includes a cache and the method, apparatuses, and non-transitory computer-readable medium may include further operations, features, circuitry, logic, means, or instructions for writing data from the non-volatile memory array to the cache in response to determining to operate the non-volatile memory array in the second mode, where the cache may be configured to be powered when the non-volatile memory array may be operating in the second mode.

In some examples of the method 500 and the apparatus described herein, deactivating the regulator may include operations, features, circuitry, logic, means, or instructions for removing a control signal from the regulator in response to determining to operate the non-volatile memory array in the second mode, where the non-volatile memory array may be isolated from the first voltage source in response to removing the control signal from the regulator.

In some examples of the method 500 and the apparatus described herein, the control signal may be removed from the regulator a duration after supplying the second voltage to the one or more components.

In some examples of the method 500 and the apparatus described herein, supplying the second voltage to the one or more components may include operations, features, circuitry, logic, means, or instructions for applying a signal to the charge pump in response to determining to operate the non-volatile memory array in the second mode, where the charge pump may be configured to apply the second voltage to the one or more components in response to receiving the third voltage from the second voltage source.

Some examples of the method 500 and the apparatus described herein may further include operations, features, circuitry, logic, means, or instructions for determining to operate the non-volatile memory array in the first mode, where the regulator may be activated in response to determining to operate the non-volatile memory array in the first mode.

Some examples of the method 500 and the apparatus described herein may further include operations, features, circuitry, logic, means, or instructions for activating the regulator in response to determining to operate the non-volatile memory array in the first mode, where the second voltage may be applied to the non-volatile memory array in response to activating the regulator and deactivating the charge pump to cease supplying the second voltage to the one or more components in response to activating the regulator.

In some examples of the method 500 and the apparatus described herein, the one or more components associated with the non-volatile memory array includes a cache and the method, apparatuses, and non-transitory computer-readable medium may include further operations, features, circuitry, logic, means, or instructions for writing data from the cache to the non-volatile memory array upon operating the non-volatile memory array in the first mode.

In some examples of the method 500 and the apparatus described herein, the one or more components associated with the non-volatile memory array includes a cache and the method, apparatuses, and non-transitory computer-readable medium may include further operations, features, circuitry, logic, means, or instructions for storing control information to the cache, where the cache may be configured to store the control information when the non-volatile memory array may be operating in the second mode, and where the control information includes trim settings for operating the non-volatile memory array.

In some examples of the method 500 and the apparatus described herein, the first voltage may be greater than the second voltage and the third voltage.

It should be noted that the methods described above describe possible implementations, and that the operations and the steps may be rearranged or otherwise modified and that other implementations are possible. Further, portions from two or more of the methods may be combined.

An apparatus is described. The apparatus may include a non-volatile memory array configured to operate in a first mode associated with a first power state of the apparatus and a second mode associated with a second power state of the apparatus, the first power state of the apparatus being higher than the second power state of the apparatus, a first voltage source configured to supply a first voltage to the non-volatile memory array, a regulator configured to receive the first voltage and supply a second voltage to one or more components associated with the non-volatile memory array in response to operating in the first mode and to isolate the one or more components from the first voltage source in response to operating in the second mode, a second voltage source configured to supply a third voltage to one or more I/O components associated with the non-volatile memory array in response to operating in the first mode or the second mode, and a charge pump configured to receive the third voltage and supply the second voltage to the one or more components associated with the non-volatile memory array in response to operating in the second mode In some examples of the apparatus, the one or more components associated with the non-volatile memory array include a cache configured to store control information and user data when the non-volatile memory array may be operating in the second mode.

In some examples of the apparatus, the non-volatile memory array may be configured to operate using the control information stored in the cache in response to operating in the first mode, and the user data may be configured to be stored to the non-volatile memory array in response to the non-volatile memory array operating in the first mode.

In some examples of the apparatus, the charge pump may be configured to power the cache when the non-volatile memory array may be operating in the second mode.

In some examples, the apparatus may include a controller configured to cause the apparatus to apply a control signal to the regulator in response to operating in the first mode, where the regulator may be configured to couple the one or more components associated with the non-volatile memory array with the first voltage source in response to the controller applying the control signal.

In some examples, the apparatus may include remove the control signal from the regulator in response to operating in the second mode, where the regulator may be configured to isolate the one or more components associated with the non-volatile memory array from the first voltage source in response to the controller removing the control signal and activate the charge pump in response to removing the control signal from the regulator.

In some examples of the apparatus, the charge pump may be configured to be activated when the non-volatile memory array may be operating in the second mode.

In some examples of the apparatus, the regulator may be configured as a diode in response to the non-volatile memory array operating in the second mode.

In some examples of the apparatus, the regulator includes at least one n-channel transistor configured to couple the one or more components associated with the non-volatile memory array with the first voltage source in response to operating in the first mode and isolate the one or more components from the first voltage source in response to operating in the second mode.

Another apparatus is described. The apparatus may include a non-volatile memory array configured to operate in a first mode and a second mode, a regulator coupled with the non-volatile memory array and one or more components associated with the non-volatile memory array, a first voltage source coupled with the regulator, a charge pump coupled with the one or more components associated with the non-volatile memory array, a second voltage source coupled with the charge pump, a controller coupled with at least the regulator and the charge pump, the controller operable to, determine to operate the non-volatile memory array and the one or more components associated with the non-volatile memory array in the second mode, deactivate the regulator in response to determining to operate the non-volatile memory array and the one or more components associated with the non-volatile memory array in the second mode, and activate the charge pump to supply a second voltage from the second voltage source to the one or more components associated with the non-volatile memory array in response to deactivating the regulator, the one or more components associated with the non-volatile memory array are configured to be powered when operating in the second mode In some examples, the apparatus may include write data from the non-volatile memory array to the cache in response to determining to operate the non-volatile memory array and the one or more components associated with the non-volatile memory array in the second mode.

In some examples, the apparatus may include write data from the cache to the non-volatile memory array in response to operating the non-volatile memory array and the one or more components associated with the non-volatile memory array in the first mode.

In some examples, the apparatus may include store control information to the cache, where the cache may be configured to store the control information when the non-volatile memory array and the one or more components associated with the non-volatile memory array may be operating in the second mode and operate the non-volatile memory array according to the control information stored to the cache when the non-volatile memory array and the one or more components associated with the non-volatile memory array may be operating in the first mode.

In some examples, the apparatus may include determine to operate the non-volatile memory array and the one or more components associated with the non-volatile memory array in the first mode, activate the regulator to apply the second voltage from the first voltage source to the non-volatile memory array and the one or more components associated with the non-volatile memory array in response to determining to operate the non-volatile memory array and the one or more components associated with the non-volatile memory array in the first mode, and deactivate the charge pump in response to activating the regulator.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," "based at least in part on," and "in response to," may be used interchangeably. In some examples, if the terms "if," "when," "based on," "based at least in part on," and "in response to," are used to describe a conditional action or connection between portions of a process, the terms may be interchangeable. In some examples, if used to describe a conditional action or process, the terms "if," "when," "based on," "based at least in part on," and "in response to" may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a non-volatile memory array configured to operate in a first mode associated with a first power state of the apparatus and a second mode associated with a second power state of the apparatus;
   a regulator configured to receive a first voltage and supply a second voltage to one or more components associated with the non-volatile memory array based at least in part on operating in the first mode and to isolate the one or more components from a first voltage source based at least in part on operating in the second mode;
   a second voltage source configured to supply a third voltage to one or more input/output (I/O) components associated with the non-volatile memory array based at least in part on operating in the first mode or the second mode; and
   a charge pump configured to receive the third voltage and supply the second voltage to the one or more components associated with the non-volatile memory array based at least in part on operating in the second mode.

2. The apparatus of claim 1, wherein the one or more components associated with the non-volatile memory array comprise:
   a cache configured to store control information and user data when the non-volatile memory array is operating in the second mode.

3. The apparatus of claim 2, wherein the non-volatile memory array is configured to operate using the control information stored in the cache when operating in the first mode, and wherein the user data is configured to be stored to the non-volatile memory array when the non-volatile memory array is operating in the first mode.

4. The apparatus of claim 2, wherein the charge pump is configured to power the cache when the non-volatile memory array is operating in the second mode.

5. The apparatus of claim 1, further comprising:
a controller configured to cause the apparatus to apply a signal to the regulator based at least in part on operating in the first mode, wherein the regulator is configured to couple the one or more components associated with the non-volatile memory array with the first voltage source based at least in part on the controller applying the signal.

6. The apparatus of claim 5, wherein the controller is configured to cause the apparatus to:
remove the signal from the regulator based at least in part on operating in the second mode, wherein the regulator is configured to isolate the one or more components associated with the non-volatile memory array from the first voltage source based at least in part on the controller removing the signal; and
activate the charge pump based at least in part on removing the signal from the regulator.

7. The apparatus of claim 1, wherein the charge pump is configured to be activated based at least in part on the non-volatile memory array operating in the second mode.

8. The apparatus of claim 1, wherein the regulator is configured as a diode based at least in part on the non-volatile memory array operating in the second mode.

9. The apparatus of claim 1, wherein the regulator comprises at least one transistor configured to couple the one or more components associated with the non-volatile memory array with the first voltage source based at least in part on operating in the first mode and isolate the one or more components from the first voltage source based at least in part on operating in the second mode.

10. A non-transitory computer-readable medium storing code comprising instructions which, when executed by a processor of an electronic device, cause the electronic device to:
supply, by a regulator, a first voltage to a non-volatile memory array and one or more components associated with the non-volatile memory array based at least in part on operating in a first mode;
receive, at a charge pump, a second voltage from a voltage source that is configured to supply the second voltage to one or more input/output (I/O) components associated with the non-volatile memory array;
deactivate the regulator to cease supplying the first voltage to the non-volatile memory array and the one or more components based at least in part on operating the non-volatile memory array in a second mode; and
supply, by the charge pump, the first voltage to the one or more components based at least in part on operating the non-volatile memory array in the second mode.

11. The non-transitory computer-readable medium of claim 10, wherein the instructions, when executed by the processor of the electronic device, further cause the electronic device to:
determine to operate the non-volatile memory array in the second mode, wherein the regulator is deactivated based at least in part on determining to operate the non-volatile memory array in the second mode.

12. The non-transitory computer-readable medium of claim 11, wherein the one or more components associated with the non-volatile memory array comprises a cache, and wherein the instructions, when executed by the processor of the electronic device, further cause the electronic device to:
write data from the non-volatile memory array to the cache based at least in part on determining to operate the non-volatile memory array in the second mode, wherein the cache is configured to be powered based at least in part on the non-volatile memory array operating in the second mode.

13. The non-transitory computer-readable medium of claim 11, wherein the instructions, when executed by the processor of the electronic device, further cause the electronic device to:
deactivate the regulator by removing a signal from the regulator based at least in part on determining to operate the non-volatile memory array in the second mode, wherein the non-volatile memory array is isolated from a first voltage source based at least in part on removing the signal from the regulator.

14. The non-transitory computer-readable medium of claim 13, wherein the signal is removed from the regulator during a duration associated with supplying the first voltage to the one or more components.

15. The non-transitory computer-readable medium of claim 11, wherein the instructions, when executed by the processor of the electronic device, further cause the electronic device to:
supply the first voltage to the one or more components by applying a signal to the charge pump based at least in part on determining to operate the non-volatile memory array in the second mode, wherein the charge pump is configured to apply the first voltage to the one or more components based at least in part on receiving the second voltage from the voltage source.

16. The non-transitory computer-readable medium of claim 10, wherein the instructions, when executed by the processor of the electronic device, further cause the electronic device to determine to:
operate the non-volatile memory array in the first mode, wherein the regulator is activated based at least in part on determining to operate the non-volatile memory array in the first mode.

17. The non-transitory computer-readable medium of claim 16, wherein the instructions, when executed by the processor of the electronic device, further cause the electronic device to:
activate the regulator based at least in part on determining to operate the non-volatile memory array in the first mode, wherein the first voltage is applied to the non-volatile memory array based at least in part on activating the regulator; and
deactivate the charge pump to cease supplying the first voltage to the one or more components based at least in part on activating the regulator.

18. The non-transitory computer-readable medium of claim 16, wherein the one or more components associated with the non-volatile memory array comprises a cache, and wherein the instructions, when executed by the processor of the electronic device, further cause the electronic device to:
write data from the cache to the non-volatile memory array upon operating the non-volatile memory array in the first mode.

19. A method, comprising:
supplying, by a regulator, a first voltage to a non-volatile memory array and one or more components associated with the non-volatile memory array based at least in part on operating in a first mode;
receiving, at a charge pump, a second voltage from a voltage source that is configured to supply the second voltage to one or more input/output (I/O) components associated with the non-volatile memory array;

deactivating the regulator to cease supplying the first voltage to the non-volatile memory array and the one or more components based at least in part on operating the non-volatile memory array in a second mode; and supplying, by the charge pump, the first voltage to the one or more components based at least in part on operating the non-volatile memory array in the second mode.

20. The method of claim 19, further comprising:

determining to operate the non-volatile memory array in the second mode, wherein the regulator is deactivated based at least in part on determining to operate the non-volatile memory array in the second mode.

\* \* \* \* \*